(12) United States Patent
Sun et al.

(10) Patent No.: US 7,402,770 B2
(45) Date of Patent: Jul. 22, 2008

(54) NANO STRUCTURE ELECTRODE DESIGN

(75) Inventors: Sey-Shing Sun, Portland, OR (US); Hemanshu D. Bhatt, Troutdale, OR (US); Peter A. Burke, Portland, OR (US); Richard J. Carter, Fairview, OR (US)

(73) Assignee: LSI Logic Corporation, Milpitas, CA (US)

( * ) Notice: Subject to any disclaimer, the term of this patent is extended or adjusted under 35 U.S.C. 154(b) by 92 days.

(21) Appl. No.: 11/270,104

(22) Filed: Nov. 9, 2005

(65) Prior Publication Data

US 2006/0278902 A1 Dec. 14, 2006

Related U.S. Application Data

(60) Provisional application No. 60/689,391, filed on Jun. 10, 2005.

(51) Int. Cl.
*H01H 9/00* (2006.01)
*G11C 11/50* (2006.01)
*H01L 21/00* (2006.01)
*H01L 23/58* (2006.01)

(52) U.S. Cl. .................. 200/238; 365/164; 257/209; 257/798; 438/128; 438/800; 977/724

(58) Field of Classification Search .............. 200/238; 365/164; 438/128, 800; 257/209, 798; 977/724
See application file for complete search history.

(56) References Cited

U.S. PATENT DOCUMENTS

| | | | |
|---|---|---|---|
| 6,990,009 B2 * | 1/2006 | Bertin et al. | 365/151 |
| 7,115,960 B2 * | 10/2006 | Bertin et al. | 257/420 |
| 7,279,231 B2 | 10/2007 | Chebiam et al. | |
| 2004/0253826 A1 | 12/2004 | Ivanov et al. | |
| 2005/0035344 A1 * | 2/2005 | Bertin et al. | 257/17 |
| 2005/0047244 A1 | 3/2005 | Rueckes et al. | |
| 2005/0052894 A1 | 3/2005 | Segal et al. | |
| 2005/0053525 A1 | 3/2005 | Segal et al. | |
| 2005/0056825 A1 | 3/2005 | Bertin et al. | |
| 2005/0056866 A1 | 3/2005 | Bertin et al. | |
| 2005/0056877 A1 | 3/2005 | Rueckes et al. | |
| 2005/0058590 A1 | 3/2005 | Sen et al. | |
| 2005/0058797 A1 | 3/2005 | Sen et al. | |
| 2005/0058834 A1 | 3/2005 | Rueckes et al. | |
| 2005/0059176 A1 | 3/2005 | Rueckes et al. | |
| 2005/0059210 A1 | 3/2005 | Rueckes et al. | |
| 2005/0062035 A1 | 3/2005 | Bertin et al. | |
| 2005/0062062 A1 | 3/2005 | Bertin et al. | |
| 2005/0062070 A1 | 3/2005 | Bertin et al. | |
| 2005/0063210 A1 | 3/2005 | Segal et al. | |
| 2005/0063244 A1 | 3/2005 | Bertin et al. | |
| 2005/0065741 A1 | 3/2005 | Segal et al. | |
| 2005/0074926 A1 | 4/2005 | Bertin et al. | |

(Continued)

*Primary Examiner*—Evan Pert
(74) *Attorney, Agent, or Firm*—Luedeka Neely & Graham

(57) ABSTRACT

A microelectronic switch having a substrate layer, an electrically conductive switching layer formed on the substrate layer, an electrically conductive cavity layer formed on the switching layer, an electrically conductive cap layer formed on the cavity layer, the cap layer forming a first electrode and a second electrode that are physically and electrically separated one from another, and which both at least partially overlie the switching layer, and a cavity disposed between the switching layer and the second electrode, where the switching is layer is flexible to make electrical contact with the second electrode by flexing through the cavity upon selective application of an electrical bias.

20 Claims, 3 Drawing Sheets

U.S. PATENT DOCUMENTS

| | | |
|---|---|---|
| 2005/0101112 A1 | 5/2005 | Rueckes et al. |
| 2005/0128788 A1 | 6/2005 | Segal et al. |
| 2005/0174842 A1 | 8/2005 | Bertin et al. |
| 2005/0191495 A1 | 9/2005 | Rueckes et al. |
| 2005/0237781 A1 | 10/2005 | Bertin et al. |
| 2005/0269553 A1 | 12/2005 | Sen et al. |
| 2005/0269554 A1 | 12/2005 | Sen et al. |
| 2005/0282516 A1 | 12/2005 | Bertin |
| 2006/0044035 A1 | 3/2006 | Bertin |
| 2006/0061389 A1 | 3/2006 | Bertin |
| 2006/0125033 A1 | 6/2006 | Segal et al. |
| 2006/0128049 A1 | 6/2006 | Jaiprakash et al. |
| 2006/0183278 A1 | 8/2006 | Bertin et al. |
| 2006/0193093 A1 | 8/2006 | Bertin et al |
| 2006/0204427 A1 | 9/2006 | Genchui et al. |
| 2006/0231865 A1 | 10/2006 | Rueckes et al. |
| 2006/0237805 A1 | 10/2006 | Segal et al. |
| 2006/0250843 A1 | 11/2006 | Bertin et al. |
| 2006/0250856 A1 | 11/2006 | Bertin et al. |
| 2006/0255834 A1 | 11/2006 | Bertin |
| 2006/0276056 A1 | 12/2006 | Ward et al. |
| 2007/0018260 A1 | 1/2007 | Jaiprakash et al. |
| 2007/0020859 A1 | 1/2007 | Bertin et al. |
| 2007/0030721 A1 | 2/2007 | Segal et al. |
| 2007/0063740 A1 | 3/2007 | Bertin et al. |
| 2007/0108482 A1 | 5/2007 | Bertin et al. |
| 2007/0115027 A1 | 5/2007 | Bertin |
| 2007/0121364 A1 | 5/2007 | Bertin et al. |
| 2007/0127285 A1 | 6/2007 | Bertin et al. |
| 2007/0141746 A1 | 6/2007 | Rueckes et al. |
| 2007/0210825 A1 | 9/2007 | Bertin |
| 2007/0210845 A1 | 9/2007 | Bertin |
| 2007/0235826 A1 | 10/2007 | Jalprakash et al. |
| 2007/0236325 A1 | 10/2007 | Claude et al. |

* cited by examiner

NANO STRUCTURE ELECTRODE DESIGN

FIELD

This application claims priority on provisional patent application 60/689,391 filed 2005 Jun. 10.

This invention relates to the field of integrated circuit fabrication. More particularly, this invention relates to forming switching structures within integrated circuits.

BACKGROUND

Carbon nanotube technology is quickly becoming a technological area that is making an impact on the field of microelectronic devices. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Single-wall carbon nanotubes are quasi one-dimensional nanowires, which exhibit either metallic or semiconducting properties, depending upon their chirality and radius. Single-wall nanotubes have been demonstrated as both semiconducting layers in thin film transistors as well as metallic interconnects between metal layers.

One technology uses carbon nanotubes as an electromechanical switch for non-volatile memory devices, where the nanotubes are spin-deposited over a patterned substrate surface. The nanotubes 12 lay over trenches 14 between a first electrode 16 and a second electrode 18 of an integrated circuit 10, as depicted in FIG. 1. The device 20 is switched on by applying a bias to the second electrode 18, and switched off by removing the bias to the second electrode 18, and applying a bias to the first electrode 16.

A two-terminal switching device 20 can be made by overlapping a metal layer over a nanotube layer 12, as depicted in FIG. 2, where the metal layer is segmented into a first electrode 16 and a second electrode 18. By applying a voltage to the nanotube layer 18, a nanoscale space or cavity 14 is melted between the overlapping portions of the nanotube layer 12 and the second electrode 18, which cavity 14 becomes the switching region for the switch 20. The cavity 14 allows the distal end of the nanotube layer 12 to move freely to perform switching function.

In this method, however, the formation of the cavity 14 is not a controlled process. For example, the variation in the density of the carbon nanotube layer under the second electrode 18 can by itself lead to a wide variation in the various sizes of the cavities 14 that are formed in integrated circuits from across a substrate. Because the height of the cavity 14 determines the switching voltage of the device 20, the switching characteristics can therefore vary greatly across the substrate. Furthermore, there is no limitation in the amount of the metal that forms the second electrode 18 that can be consumed during the melting process. Continued operation of the switch 20 may result in a total consumption of the second electrode 18, and thus reduce the operation lifetime of the switch 20.

What is needed, therefore, are alternate designs for nanotube switch structures, and alternate methods for the fabrication thereof.

SUMMARY

The above and other needs are met by a microelectronic switch having a substrate layer, an electrically conductive switching layer formed on the substrate layer, an electrically conductive cavity layer formed on the switching layer, an electrically conductive cap layer formed on the cavity layer, the cap layer forming a first electrode and a second electrode that are physically and electrically separated one from another, and which both at least partially overlie the switching layer, and a cavity disposed between the switching layer and the second electrode, where the switching is layer is flexible to make electrical contact with the second electrode by flexing through the cavity upon selective application of an electrical bias.

The cavity allows the end of the switching layer to flex, and provides the switch action of the switch when a bias is applied. Because the cavity height is defined by the thickness of the cavity layer, which can be controlled to be very uniform across the surface of the substrate on which the integrated circuits that include the switch are formed, there is a very uniform threshold voltage distribution from switch to switch across the surface of the substrate. Further, the cap layer forms a second electrode that does not melt in the same manner as the cavity layer, which reduces degradation of the second electrode as the switch is used, and tends to extend the life of the switch.

In various embodiments, the switching layer is formed on a silicon substrate. The switching layer is preferably formed of carbon nanotubes. Preferably, the cavity layer is formed of at least one of Al, Zn, Cd, In, Sn, Sb, Pb, Bi and their alloys. The cavity layer is preferably formed with a tensile stress in the cavity layer. Preferably, the cavity layer is formed with a porosity that is sufficient to absorb the melted cavity layer within the cavity. In the preferred embodiments, the cavity layer is formed of a material having a lower melting point than the cap layer. Preferably, the second electrode overlaps the switching layer by about one hundred nanometers.

An integrated circuit including the microelectronic switch formed according to the methods described above is also described.

According to another aspect of the invention there is described a method of forming a microelectronic switch by forming an electrically conductive switching layer, and forming an electrically conductive cavity layer overlying the switching layer. An electrically conductive cap layer is formed overlying the cavity layer. A first electrode and a second electrode are formed of the cap layer, where the first electrode and the second electrode are physically and electrically separated one from another, and the first electrode and the second electrode both at least partially overlie the switching layer. A passivation layer is formed between and overlying the first electrode and the second electrode. A cavity is formed between the switching layer and the overlying portion of the second electrode by applying a current between the switching layer and the overlying portion of the second electrode, where the current is sufficient to create a Joule heating effect within the cavity layer between the switching layer and the overlying portion of the second electrode, and melt the cavity layer between the switching layer and the overlying portion of the second electrode.

In various embodiments, the switching layer is formed on a silicon substrate. The switching layer is preferably formed of carbon nanotubes. Preferably, the cavity layer is formed of at least one of Al, Zn, Cd, In, Sn, Sb, Pb, Bi and their alloys. The cavity layer is preferably formed with a tensile stress in the cavity layer. Preferably, the cavity layer is formed with a porosity that is sufficient to absorb the melted cavity layer within the cavity. In the preferred embodiments, the cavity layer is formed of a material having a lower melting point than the cap layer. Preferably, the second electrode overlaps the switching layer by about one hundred nanometers.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

One aspect of the invention as described herein is a novel method to form the second electrode 18 for an electromechanical-based switching device 20. The design makes the height and size of the cavity 14 more readily controllable, with added robustness for long service lifetime. This is accomplished by employing a two layer metal scheme, as illustrated in the following steps.

Figure 1:
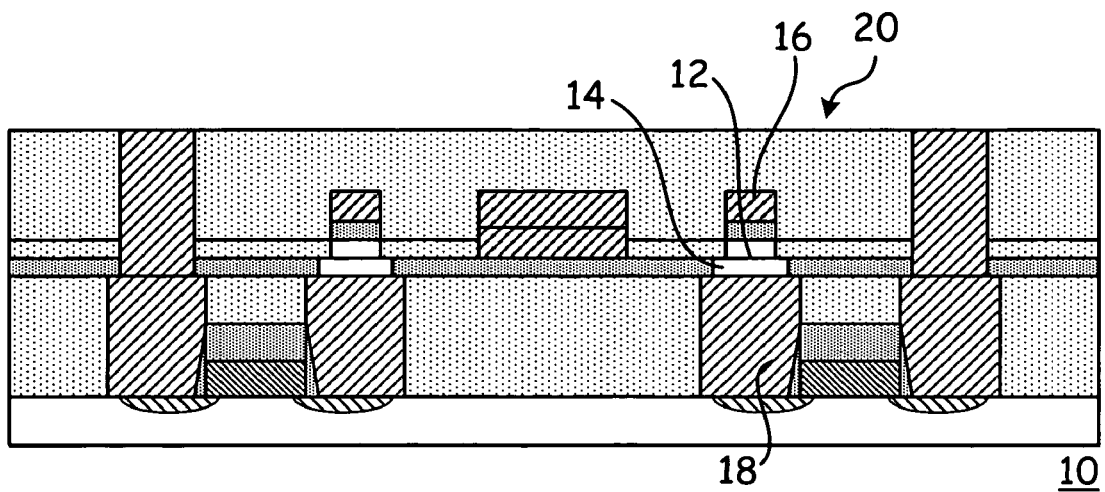
FIG. 1 is a cross sectional depiction of a first prior art nanotube structure.
Figure 2:
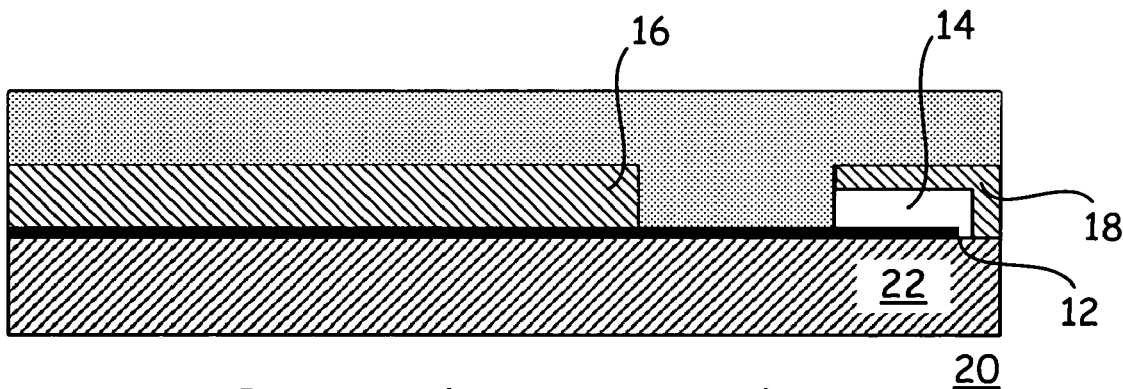
FIG. 2 is a cross sectional depiction of a second prior art nanotube structure.
Figure 3:
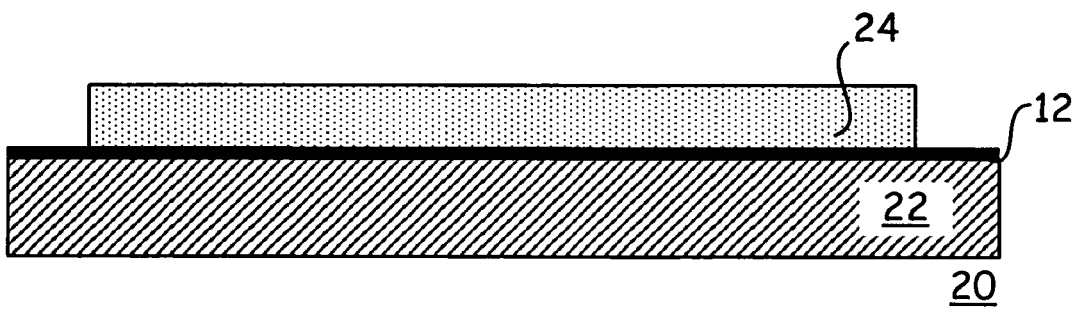
FIG. 3 is a cross sectional depiction of a patterned carbon nanotube layer according to a preferred embodiment of a method according to the present invention.
Figure 4:
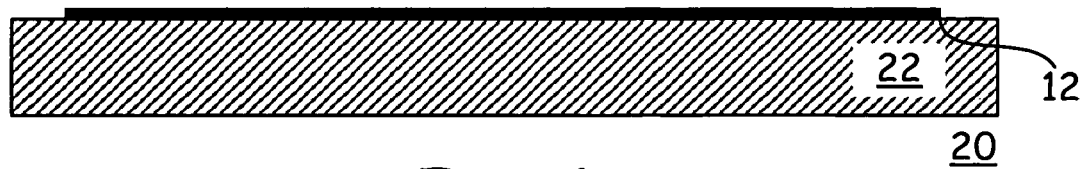
FIG. 4 is a cross sectional depiction of an etched carbon nanotube layer according to the preferred embodiment of the method according to the present invention.

A carbon nanotube layer 12 is deposited on a substrate 22, in a portion of the integrated circuit 10 where the switch 20 is desired. A photo resist layer 24 is formed and patterned over the carbon nanotube layer 12. The photoresist layer 24 is patterned to define the desired carbon nanotube layer 12, and etch off undesired portions of the carbon nanotube layer 12, such as with an oxygen plasma. The remaining carbon nanotube layer 12 is depicted in FIG. 4.

Figure 5:
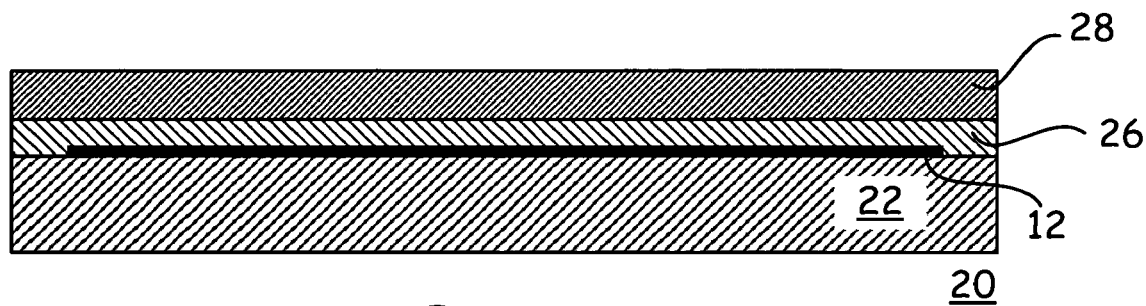
FIG. 5 is a cross sectional depiction of a cap layer and cavity layer overlying the carbon nanotube layer according to the preferred embodiment of the method according to the present invention.

A bilayer metal stack is deposited as depicted in FIG. 5. The bilayer metal stack preferably consists of a cavity metal layer 26 and a cap metal layer 28. It is not essential that bilayer stack be formed of metals, but could alternately be formed of other electrically conductive materials that have the general properties as described below. The cavity metal layer 26 is preferably in direct physical and electrical contact with the carbon nanotube layer 12, without any intervening layers of any kind. The cavity metal layer 26 is preferably formed of a material that will readily melt back to form the cavity 14 when the carbon nanotube layer 12 is heated through Joule heating, upon application of a current.

The cavity metal layer 26 is preferably formed of low melting metals, such as Al, Zn, Cd, In, Sn, Sb, Pb, Bi and their alloys. In addition, the cavity metal layer 26 preferably has a porous structure, and is deposited in tensile stress to provide additional free energy for repeatable cavity formation. A tensile and porous structure can be achieved by depositing films under conditions that limit the mobility of adatoms on substrates, such as a high deposition pressure, low substrate temperature, low deposition power sputtering process.

The cap metal layer 28 provides a solid backing for the cavity metal layer 26, to ensure the longevity of the switch 20, as described in more detail below. The cap metal layer 28 is preferably formed of refractory metals and their metal nitrides, such as TiN, TaN, Ta, and W. The cap metal layer 28 preferably does not have a melting point that is as low as that for the cavity metal layer 26. Nor does the cap metal layer 28 need to be deposited with a tensile stress or be particularly porous, although it could have these properties.

Figure 6:
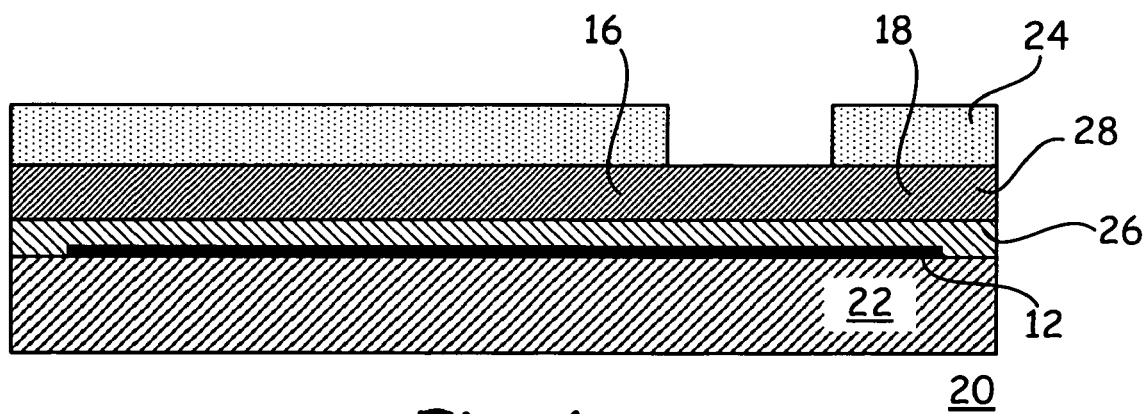
FIG. 6 is a cross sectional depiction of a patterned cap layer overlying the carbon nanotube layer according to the preferred embodiment of the method according to the present invention.
Figure 7:
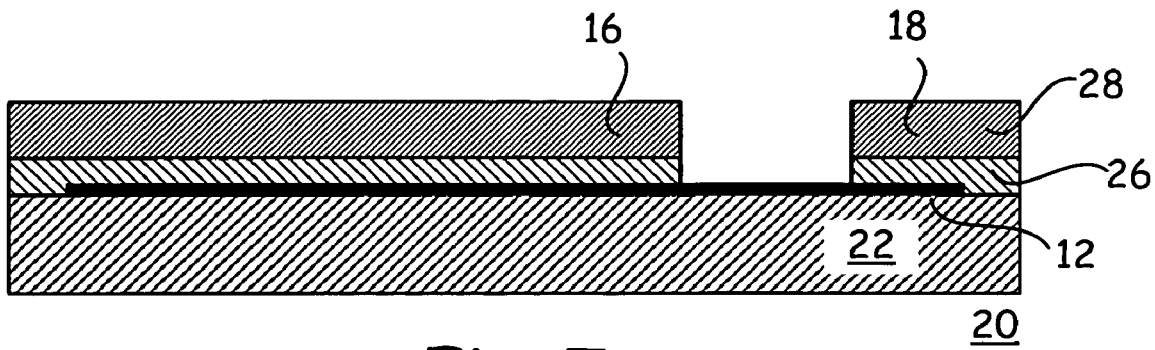
FIG. 7 is a cross sectional depiction of an etched cap layer and cavity layer overlying the carbon nanotube layer according to the preferred embodiment of the method according to the present invention.
Figure 8:
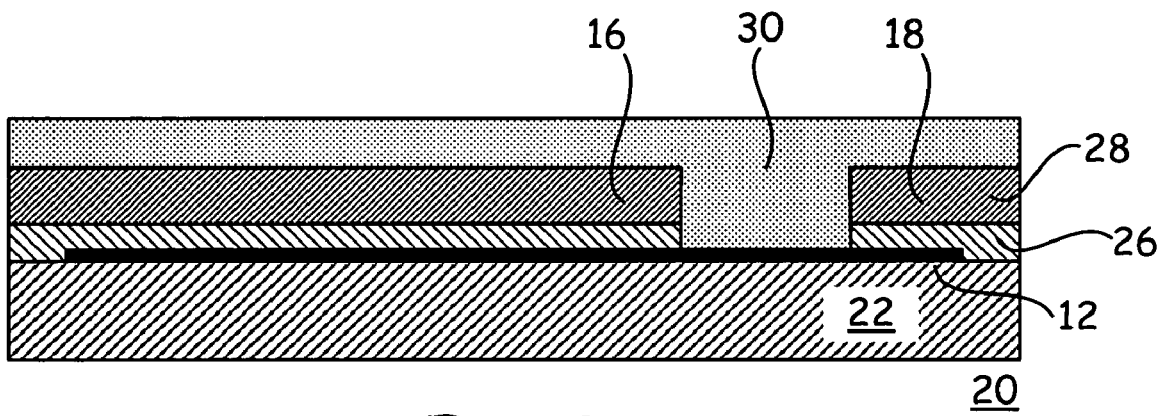
FIG. 8 is a cross sectional depiction of a passivation layer overlying the cap layer, cavity layer, and carbon nanotube layer according to the preferred embodiment of the method according to the present invention.

As depicted in FIG. 6, the bilayer metal stack 26, 28 is patterned to define the first or fixed electrode 16 and the second or program electrode 18. The second electrode 18 preferably overlaps the carbon nanotube layer 12 by about one hundred nanometers, as depicted in FIG. 7. A passivation layer 30, such as silicon oxide, is preferably deposited over the entire surface of the integrated circuit 10 to provide environmental and mechanical protection, as depicted in FIG. 8.

The cavity 14 is formed in the cavity metal layer 26 when an electric current is passed through the carbon nanotube layer 12. The electric current is preferably selected so as to be sufficient to create a Joule heating effect in the cavity metal layer 26 between the second electrode 18 and the carbon nanotube layer 12 that underlies the second electrode 18. The relatively low melting point of the cavity metal layer 26, in regard to the surrounding structures, preferably allows the material of the cavity metal layer 26 to melt without damaging the surrounding structure and without significant impact to the overall thermal load of the integrated circuit 10 being formed. Preferably, the current and other conditions of the fabrication of the switch 20 are set so that no melting occurs in the cavity metal layer 26 in the region of the first electrode 16. Both the tensile stress and porosity of the cavity metal layer 26 tend to enable the creation of the cavity 14 as the cavity metal layer 26 is melted in the area of the cavity 14.

Figure 9:
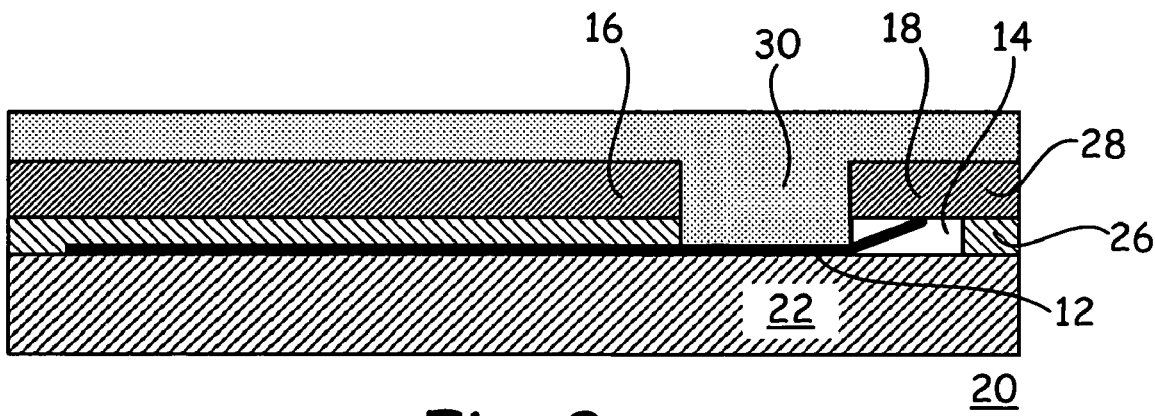
FIG. 9 is a cross sectional depiction of completed carbon nanotube device formed according to the preferred embodiment of the method according to the present invention.

The cavity 14 as depicted in FIG. 9 allows the end of the carbon nanotube layer 12 to flex, and provides the switch action of the switch 20 when a bias is applied. Because the cavity 14 height is defined by the thickness of the cavity metal layer 26, which can be controlled to be very uniform across the surface of the substrate on which the integrated circuits 10 are formed, there is a very uniform threshold voltage distribution from switch 20 to switch 20 across the surface of the substrate. Further, the metal layer 28 forms a second electrode 18 that does not melt in the same manner as the cavity metal layer 26, which reduces degradation of the second electrode 18 as the switch 20 is used, and tends to extend the life of the switch 20.

Other device 20 architectures include a third electrode disposed in the cavity 14 and below the second electrode 18 and the carbon nanotube layer 12, for switching devices off instead of relying on the pulsing the second electrode 18.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A microelectronic switch, comprising:
   a substrate layer,
   an electrically conductive switching layer formed on the substrate layer,
   an electrically conductive cavity layer formed on the switching layer,
   an electrically conductive cap layer formed on the cavity layer, the cap layer forming a first electrode and a second electrode that are physically and electrically separated one from another, and which both at least partially overlie the switching layer, and
   a cavity disposed between the switching layer and the second electrode,
   where the switching is layer is flexible to make electrical contact with the second electrode by flexing through the cavity upon selective application of an electrical bias.

2. The microelectronic switch of claim 1, wherein the substrate is formed of silicon.

3. The microelectronic switch of claim 1, wherein the switching layer is formed of carbon nanotubes.

4. The microelectronic switch of claim 1, wherein the cavity layer is formed of at least one of Al, Zn, Cd, In, Sn, Sb, Pb, Bi and their alloys.

5. The microelectronic switch of claim 1, wherein the cavity layer is formed with a tensile stress in the cavity layer.

6. The microelectronic switch of claim 1, wherein the cavity layer is formed with a porosity that is sufficient to absorb a volume of melted material from within the cavity.

7. The microelectronic switch of claim 1, wherein the cavity layer is formed of a material having a lower melting point than the cap layer.

8. The microelectronic switch of claim 1, wherein the second electrode overlaps the switching layer by about one hundred nanometers.

9. An integrated circuit including the microelectronic switch of claim 1.

10. A microelectronic switch, comprising:
    an electrically conductive switching layer formed of carbon nanotubes,
    an electrically conductive cavity layer formed of at least one of Al, Zn, Cd, In, Sn, Sb, Pb, Bi and their alloys, formed on the switching layer,
    an electrically conductive cap layer formed on the cavity layer with a tensile stress, the cap layer forming a first electrode and a second electrode that are physically and electrically separated one from another, and which both at least partially overlie the switching layer, wherein the cap layer is formed of a material having a higher melting point than the cavity layer, and
    a cavity disposed between the switching layer and the second electrode, where the cavity layer is formed with a porosity that is sufficient to absorb a volume of melted material from the cavity layer within the cavity, where the second electrode overlaps the switching layer by about one hundred nanometers within the cavity,
    where the switching is layer is flexible to make electrical contact with the second electrode by flexing through the cavity upon selective application of an electrical bias.

11. An integrated circuit including the microelectronic switch of claim 10.

12. A method of forming a microelectronic switch, the method comprising the steps of:
    forming an electrically conductive switching layer,
    forming an electrically conductive cavity layer overlying the switching layer,
    forming an electrically conductive cap layer overlying the cavity layer,
    forming a first electrode and a second electrode of the cap layer, where the first electrode and the second electrode are physically and electrically separated one from another, and the first electrode and the second electrode both at least partially overlie the switching layer,
    forming a passivation layer between and overlying the first electrode and the second electrode, and
    forming a cavity between the switching layer and the overlying portion of the second electrode by applying a current between the switching layer and the overlying portion of the second electrode, where the current is sufficient to create a Joule heating effect within the cavity layer between the switching layer and the overlying portion of the second electrode and melt the cavity layer between the switching layer and the overlying portion of the second electrode.

13. The method of claim 12, wherein the switching layer is formed on a silicon substrate.

14. The method of claim 12, wherein the switching layer is formed of carbon nanotubes.

15. The method of claim 12, wherein the cavity layer is formed of at least one of Al, Zn, Cd, In, Sn, Sb, Pb, Bi and their alloys.

16. The method of claim 12, wherein the cavity layer is formed with a tensile stress in the cavity layer.

17. The method of claim 12, wherein the cavity layer is formed with a porosity that is sufficient to absorb the melted cavity layer within the cavity.

18. The method of claim 12, wherein the cavity layer is formed of a material having a lower melting point than the cap layer.

19. The method of claim 12, wherein the second electrode overlaps the switching layer by about one hundred nanometers.

20. An integrated circuit including a microelectronic switch formed according to the method of claim 12.

* * * * *